United States Patent
Fillion et al.

(10) Patent No.: US 7,829,386 B2
(45) Date of Patent: Nov. 9, 2010

(54) POWER SEMICONDUCTOR PACKAGING METHOD AND STRUCTURE

(75) Inventors: Raymond Albert Fillion, Niskayuna, NY (US); Richard Alfred Beaupre, Pittsfield, MA (US); Ahmed Elasser, Latham, NY (US); Robert John Wojnarowski, Ballston Lake, NY (US); Charles Steven Korman, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 499 days.

(21) Appl. No.: 11/846,024

(22) Filed: Aug. 28, 2007

(65) Prior Publication Data

US 2008/0305582 A1 Dec. 11, 2008

Related U.S. Application Data

(63) Continuation-in-part of application No. 11/205,903, filed on Aug. 17, 2005, now Pat. No. 7,262,444.

(51) Int. Cl.
*H01L 21/48* (2006.01)
*H01L 23/34* (2006.01)

(52) U.S. Cl. .................................. 438/119; 257/727

(58) Field of Classification Search ................. 257/177, 257/727, 181, 776; 361/709, 760; 438/117–119
See application file for complete search history.

(56) References Cited

U.S. PATENT DOCUMENTS

| 4,835,704 A | 5/1989 | Eichelberger et al. |
| 5,151,769 A | 9/1992 | Immorlica, Jr. et al. |
| 5,169,678 A | 12/1992 | Cole et al. |
| 5,258,647 A | 11/1993 | Wojnarowski et al. |
| 5,324,687 A * | 6/1994 | Wojnarowski ............... 438/107 |
| 5,355,019 A | 10/1994 | Fuchs |
| 5,449,427 A | 9/1995 | Wojnarowski et al. |
| 5,497,033 A | 3/1996 | Fillion et al. |
| 5,532,512 A | 7/1996 | Fillion et al. |
| 5,554,305 A | 9/1996 | Wojnarowski et al. |
| 5,576,517 A | 11/1996 | Wojnarowski et al. |
| 5,637,922 A | 6/1997 | Fillion et al. |
| 5,672,546 A | 9/1997 | Wojnarowski |
| 5,785,787 A | 7/1998 | Wojnarowski et al. |

(Continued)

FOREIGN PATENT DOCUMENTS

EP 0452506 10/1991

(Continued)

OTHER PUBLICATIONS

EP Search Report, EP06254260, Sep. 3, 2007.

(Continued)

*Primary Examiner*—Calvin Lee
(74) *Attorney, Agent, or Firm*—Penny A. Clarke

(57) ABSTRACT

A semiconductor chip packaging structure is fabricated by using a dielectric film with two surfaces, and a power semiconductor chip with an active surface having contact pads. An adhesive layer is used to connect the first surface of the dielectric film and the active surface of the power semiconductor chip. A patterned electrically conductive layer is formed adjacent to the second surface of the film, extending through holes in the film to the contact pads.

27 Claims, 10 Drawing Sheets

U.S. PATENT DOCUMENTS

| | | | |
|---|---|---|---|
| 5,949,133 | A | 9/1999 | Wojnarowski |
| 6,002,162 | A | 12/1999 | Takahashi et al. |
| 6,229,203 | B1 | 5/2001 | Wojnarowski |
| 6,297,459 | B1 | 10/2001 | Wojnarowski et al. |
| 6,306,680 | B1 | 10/2001 | Fillion et al. |
| 6,410,356 | B1 | 6/2002 | Wojnarowski et al. |
| 2002/0121691 | A1 | 9/2002 | Wojnarowski et al. |

FOREIGN PATENT DOCUMENTS

| | | |
|---|---|---|
| EP | 0465197 | 1/1992 |
| EP | 0559384 | 9/1993 |
| EP | 0896367 | 2/1999 |
| WO | 0021027 | 4/2000 |

OTHER PUBLICATIONS

A. Welling et al., Fast implementation of the single scatter simulation algorithm and its use in interactive image reconstruction of PET data,: Institute of Physics Publishing, Phys. Med. Biol. 47 (2002), pp. 2247-2960.

M. Popall et al., "Ormocer®s—Inorganic-Organic Hybrid materials for e/o—interconnection-Technology," Mil. Cryst. and Liq. Cryst, 2000, vol. 354, pp. 123-142.

Fraunhofer Institut Silicatforschung Annual report 2003, Ormocers, pp. 44-48.

Letter Providing English summary of Dec. 7, 2009 Israeli Office Action of Israeli Patent Application No. 177322.

CPEL0654196, First Office Action, Patent Application No. 200610115024.7, Aug. 28, 2009.

Application No. 06254260.0, EP Office Action, May 29, 2008.

* cited by examiner

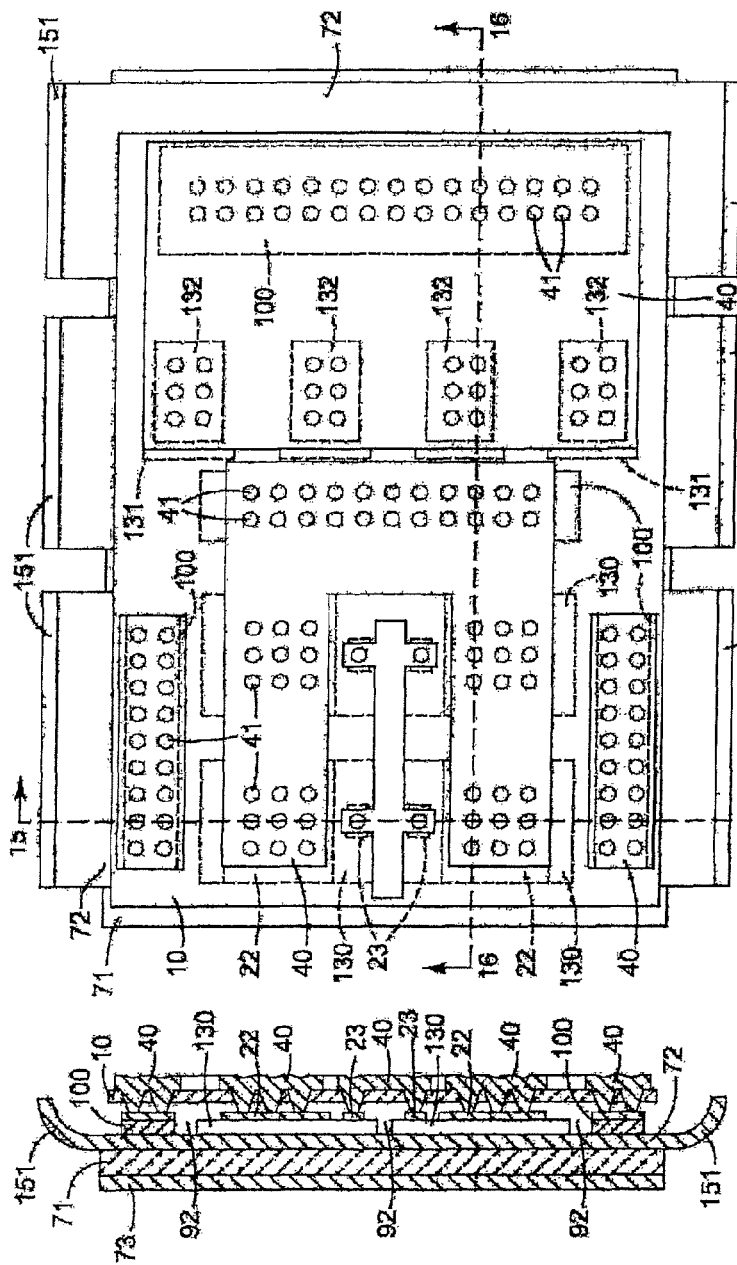
FIG. 14
FIG. 15
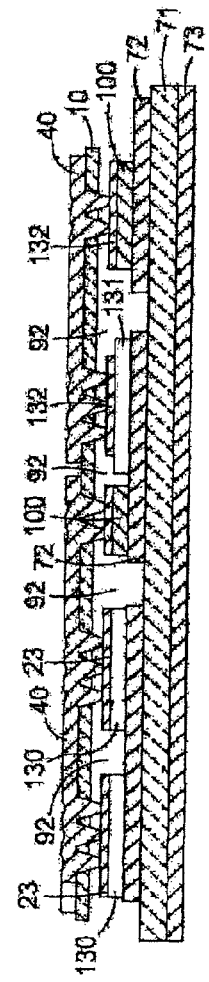
FIG. 16

POWER SEMICONDUCTOR PACKAGING METHOD AND STRUCTURE

The present patent application is a continuation-in-part application of U.S. patent application Ser. No. 11/205,903 filed 17 Aug. 2005, the disclosure of which is hereby incorporated by reference in its entirety and to which the current application claims priority under 35 U.S.C.§120.

BACKGROUND OF THE INVENTION

The present application relates generally to structures and methods for packaging power semiconductor devices.

Wide band gap semiconductor devices, such as SiC devices, have the ability to operate at highly elevated temperatures for some power electronics applications, without degrading device performance or developing failure mechanisms that would limit operating life. This attribute has the potential benefit of permitting high power operation in high temperature environments without expensive cooling structures and materials that would be required if lower operating temperatures had to be maintained. However, operating wide band gap power devices at high temperatures puts severe limitations on the packaging, assembly, interconnection materials, processes and structures.

In the past, semiconductor packaging technologies were designed for the known temperature limits of silicon and gallium arsenide devices, which are near the 125° C. to 150° C. range. Packaging structures for such devices typically incorporate polymer materials and wire bonding interconnection technology, which can be used at lower temperatures without sustaining heat damage. Packaging structures incorporating these technologies generally cannot be subjected to continuous exposure of relatively high temperatures without facing issues of degradation and reliability.

Traditional packaging technologies typically employ organic adhesion layers, which often have relatively high CTE values ranging, for example, from about 30 to about 60 ppm/C. For applications involving very cold temperatures or wide thermal cycles, the use of these organic adhesion layers may cause undesirable levels of thermal stress on packaging structures.

Using polymers in packaging structures which are not hermetically sealed may also cause problems in high moisture environments, since polymers tend to absorb moisture. Absorption of moisture can have undesirable effects, including raising the dielectric constants of the polymers and increasing parasitic capacitances.

Packaging approaches that do not contain organic polymer materials are generally complex, costly and have poor electrical performance. These inorganic based packages are generally wire bonded devices mounted onto a ceramic substrate, which includes one or more interconnect structures and die mount down pads. However, incorporating interconnect structures on ceramic substrates generally results in the use of non-optimum thermally conductive ceramic substrate material, which can in turn result in a module having a non-optimum thermal path.

Further, wire bonded devices have a number of disadvantages, including high series electrical resistance, high inductance, high levels of electromagnetic interference (EMI), application of mechanical stress to the devices, and current crowding on the device surface. Other drawbacks of wire bond assemblies include the need for large package height and large substrate footprints to accommodate the wire bond pads on the substrate. In addition, coating wire bonds with dielectrics to achieve voltage isolation can be difficult for a number of reasons, including the shape of the wire bonds, the gold metal generally used to make the bonds, and the extreme fragility of the bonds themselves. The difficulty of achieving dielectric isolation of wire bonds is becoming more of a problem because of the relatively high currents and voltages used for developing high power applications.

BRIEF DESCRIPTION

The present application is directed to various power semiconductor packaging structures and methods of making the packaging structures. The various disclosed embodiments may have one or more of the following benefits: removal of organic adhesive material and/or other organic materials that may limit device operation or cause undesirable stresses at certain elevated temperatures, during applications involving wide thermal cycles or in high moisture environments; employing one or more air gaps as part of the dielectric structure; a package interconnect structure resulting in reduced parasitic capacitances; a robust interconnect structure capable of withstanding thermal stresses caused by operation at elevated temperatures; a planar dielectric film on which to form the package interconnect structure; the absence of performance-limiting wire bonds interconnecting the chip to the interconnect structure; or a low thermal resistance cooling path.

One embodiment of the present application is directed to a method of fabricating a power semiconductor chip packaging structure. The method comprises providing a dielectric film having a first surface and a second surface. At least one power semiconductor chip with an active surface and an opposing back surface is also provided, the active surface having one or more contact pads. A layer of adhesive is applied adjacent to the first surface of the dielectric film and the dielectric film is adhered to the active surface of the at least one power semiconductor chip by bringing the active surface into physical contact with the adhesion layer. A patterned electrically conductive layer is formed adjacent to the second surface of the dielectric film, the conductive layer extending through one or more through holes formed in the dielectric film to electrically contact the one or more contact pads. The adhesion layer is removed to form one or more air gaps between the dielectric film and the active surface of the at least one power semiconductor chip.

Another embodiment is directed to a method of fabricating a power semiconductor chip packing structure that includes the elements described above, and also includes converting an adhesion layer to a second material that can withstand a continuous operating temperature of about 300° C. or greater.

These and other embodiments will be discussed more fully in the detailed description of the embodiments.

BRIEF DESCRIPTION OF THE DRAWINGS

The accompanying drawings, which are incorporated in and constitute a part of this specification, illustrate exemplary embodiments, which together with the written description, serve to explain the principles of the systems and techniques described herein. It is to be understood that the particular views chosen for the drawings are for illustrative purposes only, and are not intended to limit the scope of the disclosed systems and techniques. The drawings are generally views of only the relevant portions of the devices being described, with sufficient detail to explain the concepts pertinent to this application. Additionally, the particular orientations of the structures in the drawings are not intended to represent the orientation of the structures during fabrication, and should not be construed as limiting the claims.

In the drawings:

FIGS. 13 to 16 illustrate various top and side views of a multi-chip power module, according to one embodiment of the present application.

DETAILED DESCRIPTION

Figure 1:
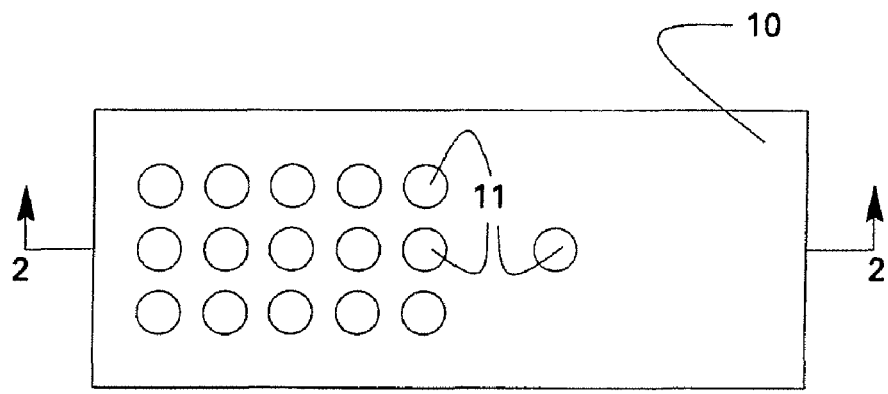
FIGS. 1 and 2 are topside and cross-sectional views of a dielectric film with a plurality of through holes, according to one embodiment of the present application.

In the following description, reference is made to the accompanying drawings, which show by way of illustration specific exemplary embodiments in which the systems and techniques described may be practiced. The following description is, therefore, not to be taken in a limited sense. Wherever possible, the same reference numbers are used throughout the drawings to refer to the same or like parts.

Approximating language, as used herein throughout the specification and claims, may be applied to modify any quantitative representation that could permissibly vary without resulting in a change in the basic function to which it is related. Accordingly, a value modified by a term or terms, such as "about", may not to be limited to the precise value specified. In at least some instances, the approximating language may correspond to the precision of an instrument for measuring the value.

The temperature at which any given semiconductor packaging structure may continuously be used depends upon, among other things, the materials employed in the packaging structure and the ability of the structure for withstanding thermal stress. Generally speaking, inorganic materials can usually withstand higher temperatures than organic materials, and often have lower coefficients of thermal expansion (CTEs), which can result in lower thermal stress levels in the package structure. However, it may be desirable to use organic materials where operating temperatures will permit, since they generally result in reduced costs compared with using inorganic-only packaging.

Accordingly, certain embodiments of the present application may be used at higher temperatures than other embodiments due to the materials employed in the final structure. For example, certain packaging structures disclosed in the present application may be used continuously at temperatures of up to 150° C. or 200° C., while others may be used continuously at still higher temperatures of up to, for example, 250° C., 300° C., 350° C. or higher.

The structures of the present application are not limited to use in high temperature applications, but may also be useful in other applications where reducing stress caused by expansion or contraction of certain materials is desirable. In some embodiments of the present application, which will be discussed in greater detail below, the removal of an adhesion layer may reduce or eliminate the stresses that the adhesion layer may apply to metal connections to the chip contact pads during low temperature applications or where wide thermal cycles are realized. Examples of such applications include the use of power devices at cryogenic temperatures of, for example, about 70 K or lower, or where power devices encounter changes in temperature of 100° C., or more, such as thermal cycling between temperatures ranging from, for example, about −40° C. to about +150° C. Similarly, the structures of the present application would also be of benefit in high moisture applications where the organic adhesion layer could absorb moisture, expand and further stress the metal connections to the chip contact pads.

The structures of the present application may be used to provide packaging for any type of power semiconductor devices, such as, but not limited to, diodes and power transistors, including for example, MOSFETs (metal oxide field effect transistors) and IGBTs (insulated gate bipolar transistors). These power semiconductor devices may comprise any suitable semiconductor material, such as Si or GaAs. In one embodiment, the semiconductor devices comprise wide band gap semiconductor materials, such as SiC devices, which are able to withstand high temperatures. Prior to packaging or interconnection, these devices are generally in the form of semiconductor chips.

Figure 7:
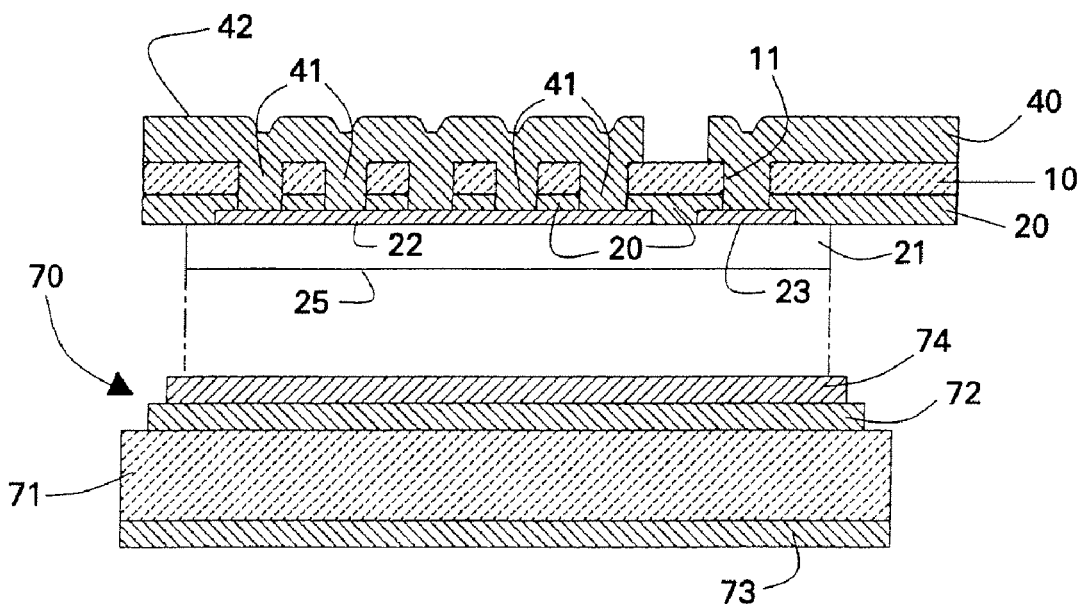
FIG. 7 is a cross-sectional view of the packaging structure of FIG. 6 aligned to a power substrate, according to one embodiment of the present application.
Figure 8:
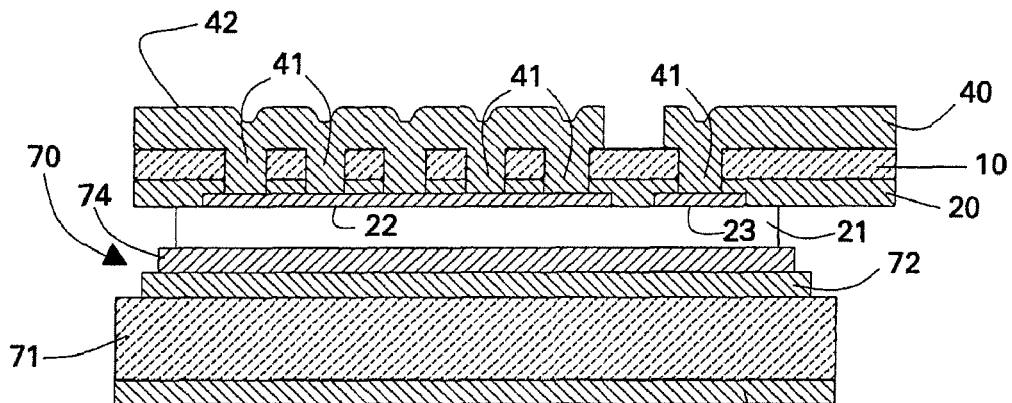
FIG. 8 is a cross-sectional view of the packaging structure of FIG. 7, after the packaging structure is attached to a power substrate, according to one embodiment of the present application.
Figure 9A:
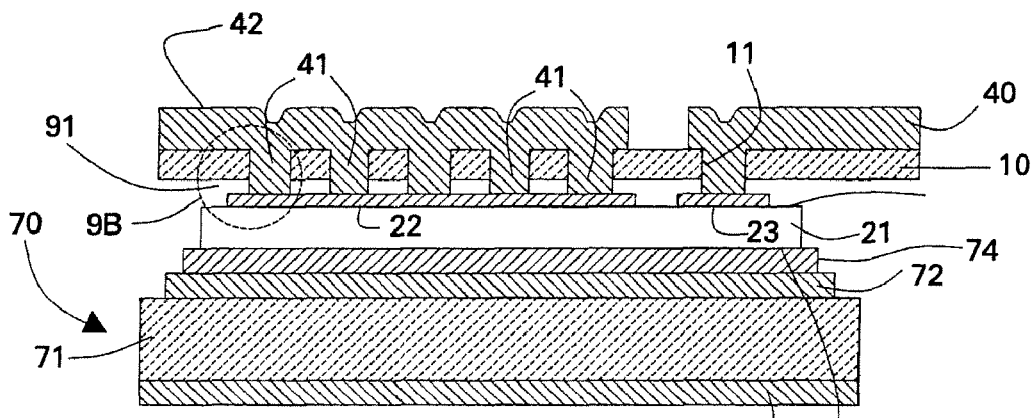
FIG. 9A is a cross-sectional view of the packaging structure of FIG. 8, after the adhesion layer has been removed, according to one embodiment of the present application.
Figure 9B:
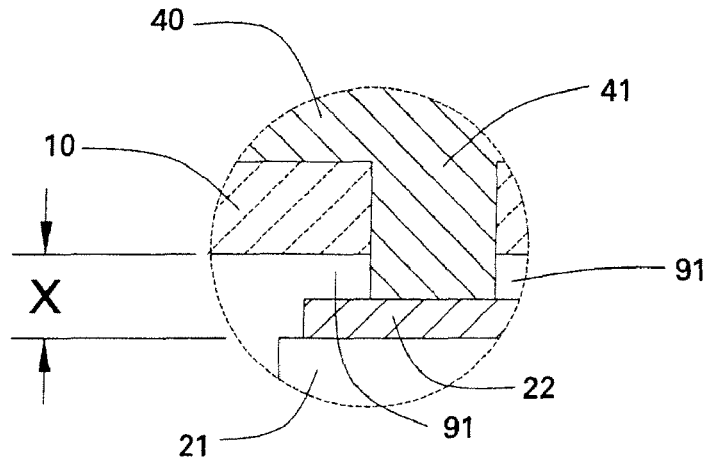
FIG. 9B is a magnified view of a portion of the packaging structure illustrated in FIG. 9A showing an air gap, according to one embodiment of the present application.

FIGS. 1 to 9B illustrate one embodiment directed to a method for fabricating a power semiconductor device packaging structure, as well as the resultant packaging structure, which is illustrated in FIG. 9A. Chip 21 of FIG. 9A is representative of semiconductor power chips which may be employed in the packaging structures of the present application. While chip 21 is illustrated as a MOSFET device, it is understood that chip 21 may comprise any type of power semiconductor device, including IGBTs and diodes, as described above.

Figure 3:
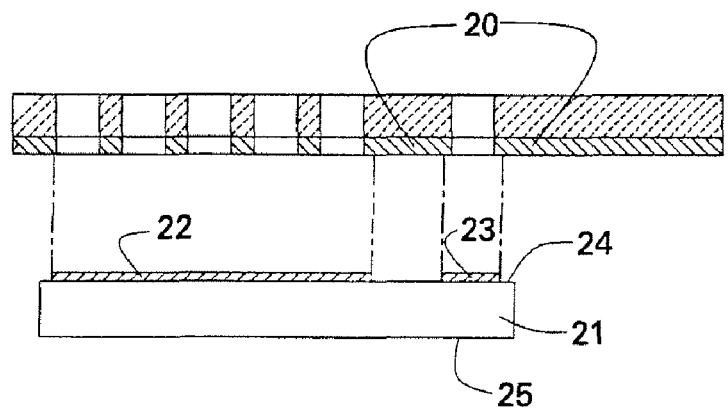
FIG. 3 is a cross-sectional view of a dielectric film and power semiconductor chip with and adhesion layer applied to the bottom surface of the dielectric film, according to one embodiment of the present application.
Figure 4:
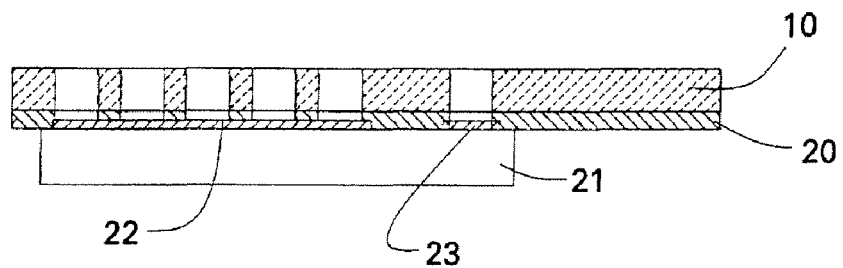
FIG. 4 is a cross-sectional view of a power semiconductor chip attached to a dielectric film using an adhesion layer, according to one embodiment of the present application.

As illustrated in FIG. 3, Chip 21 has an active surface 24 and a back surface 25. Generally speaking, active surface 21 may have one or more contact pads formed thereon, as represented by contact pads 22 and 23. As depicted, power chip 21 has two topside contact pads typical of a MOSFET device, including a large power pad 22, known as a source pad, and a smaller control pad 23, known as a gate pad. Back surface 25 may also include a back surface contact, known as a drain pad (not shown), as is well known in the art. Chip 21 may be electrically coupled to the package interconnect structure via electrical contacts made to the one or more contact pads and back surface contact, as will be described in more detail below.

Figure 2:
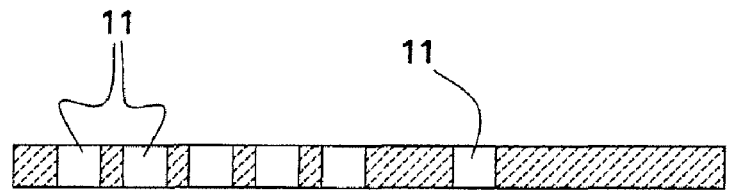

FIGS. 1 and 2 illustrate topside and cross-sectional views of one embodiment of a dielectric film 10 having a plurality of through holes 11 that extend through the thickness of the film. It is to be understood that FIGS. 1 and 2 illustrate only the portion of dielectric film 10 formed in conjunction with a single chip site, as seen in FIGS. 3 to 9. As illustrated in FIGS. 14 to 16, dielectric film 10 may cover a number of such chip sites in a multi-chip module. While dielectric film 10 is illustrated as having a rectangular shape, dielectric film 10 may have any desired shape or size which is suitable for forming the structures of the present application.

Dielectric film 10 may have any desired thickness. For example, dielectric film 10 may have a thickness ranging from about 1 micron to 25 microns, from about 25 microns to about 50 microns, from about 50 microns to about 100 microns, from about 100 microns to about 250 microns, from about 250 microns to about 500 microns, from about 500 microns to about 1000 microns, and all subranges therebetween.

In one embodiment, through holes 11 have a circular shape with vertical sidewalls, as illustrated in FIGS. 1 and 2. The shape of through holes 11 is not limited, however, and may be any suitable shape. For example, through holes 11 may have an oval shape or a square shape with rounded corners, or another more complex shape. In another embodiment, through holes 11 may have tapered sidewalls.

Dielectric film 10 may be made of any dielectric material suitable for use in semiconductor packaging structures, including either inorganic or organic electrically insulating materials. Inorganic materials which may be used include, for example, glass, ceramics, or other inorganic insulators suitable for use in power packaging structures. Specific examples of such inorganic materials include $Al_2O_3$; BeO; $Si_3N_4$; AlN; SiC; gallium nitride; AlGaN; InGaN; diamond; diamond-like carbons, such as Dylyn, which is made by Advanced Refractory Technologies of Buffalo, N.Y.; and polysilicon. In one particular embodiment, the dielectric film is a low temperature co-fired ceramic (LTCC).

Organic materials which may be employed as dielectric film 10 include any electrically insulating organic material suitable for use in semiconductor packaging structures. In one embodiment, dielectric film 10 may be an electrically insulative polymer stable for continuous use at temperatures above 150° C. Examples of suitable materials include polyimides, such as KAPTON (a trademark of E.I. DuPont de Nemours and Co.); high temperature polymers, such as polyquinoline, polyquinoxaline, and polyetherkeytone; BT (bismaleimide-triazine) resin, manufactured by Mitsubishi Gas Chemical; polyester; solder resist; epoxies; silicone based materials; and thermoplastic resins, such as ULTEM™ polyetherimide resin (ULTEM is a trademark of General Electric Company).

In one embodiment, dielectric film 10 is supported on a frame (not illustrated) during processing. Where dielectric film 10 comprises a flexible material, the frame provides support to maintain dielectric film 10 in the desired planar shape, and allows ease of processing.

Dielectric film 10 may comprise dielectric materials having a broad range of CTE values. For example, materials having CTE values of about 0 to about 5 ppm/C, from about 5 to about 10 ppm/C, from about 10 to about 20 ppm/C, from about 20 to about 30 ppm/C, and all subranges therebetween, may be used. In certain embodiments, such as embodiments that employ inorganic dielectrics having a high modulus of elasticity and high mechanical rigidity, it may be desirable to use a material for the dielectric film 10 which has CTE similar to that of chip 21, in order to reduce stress caused by the relative expansion and contraction of the chip 21 and dielectric film 10 during heating and cooling. In one such embodiment, the material employed for dielectric film 10 has an x-axis and y-axis CTE the same or similar to the x-axis and y-axis CTE, respectively, of chip 21, where the x-axis and y axis CTE define the CTE of the dielectric film in the plane of the film parallel to the top surface of chip 21 shown in FIG. 8. For example, where chip 21 is made of SiC, which has a CTE of about 3 ppm/C, the dielectric film may also be SiC, or another material with a CTE of about 3 ppm/C. In other embodiments, materials with higher CTEs may preferably be used to reduce stress in the conductive layer 40, which typically has a CTE ranging from about 15 to about 20 ppm/C, particularly if dielectric film 10 has a low modulus of elasticity or low mechanical strength and would not apply a high CTE induced stress to chip 21. For example, in one embodiment, dielectric materials having a CTE of about 10 to about 25 ppm/C may be employed to provide a CTE which is similar to the CTE of conductive layer 40. In yet another embodiment, dielectric film 10 may have CTE values that range from about 0 to about 1 ppm/C, from about 1 to about 2 ppm/C, from about 2 to about 5 ppm/C, from about 5 to about 7 ppm/C, from about 7 to about 9 pm/C, and all subranges therebetween.

Generally power devices are primarily cooled from the back surface. However, in certain embodiments where cooling is desired from the active surface, it may be desirable to use a material for dielectric film 10 that has a high thermal conductivity, such as SiC, SiN or AlN, to allow heat to be more efficiently conducted away from the active surface 24 of chip 21 through dielectric film 10.

The size and number of through holes may depend upon the size of contact pads 22 and 23 and the electrical current requirements of chip 21, among other things. For example, as illustrated in FIG. 9A, a conductive layer 40 contacts contact pad 22 through a plurality of relatively small through holes in order to meet the desired electrical current requirements for chip 21. In another embodiment, fewer through holes having larger openings may be employed to meet the same desired current requirements. For example, a single large through hole could replace the plurality of through holes aligned with contact pad 22 in the FIG. 9A embodiment. In one embodiment, through holes 11 have a diameter that ranges from, for example, 100 to 5000 microns, and all subranges therebetween.

In one embodiment, the method of forming dielectric film 10 comprises obtaining a planar dielectric film of the desired material and forming through holes 11 therein by any suitable means. In one exemplary embodiment, dielectric film 10 is a ceramic, and through holes 11 are formed by suitable mechanical methods, such as mechanical hole punching or use of a water jet, while dielectric film 10 is in the pre-fired state (i.e., green-state). In another embodiment, dielectric film is fired before forming through holes 11 by, for example, mechanical drilling, laser drilling, chemical etching techniques, or other suitable methods for forming holes in an as-fired ceramic. Forming the holes in the as-fired state may be preferable if narrow tolerances are desired for positioning the through holes in the dielectric film, since films in the pre-fired-state generally shrink when they are fired, which may make it difficult to accurately position the through holes.

FIG. 3 illustrates a cross-sectional view of dielectric film 10 having a polymeric adhesion layer 20 applied adjacent to a surface of dielectric film 10. The purpose of adhesion layer 20 is to temporarily adhere dielectric film 10 to the active surface of power semiconductor chip 21 until conductive layer 40 is formed in the subsequent processing step, illustrated in FIG. 4. Once conductive layer 40 is formed, conductive layer 40 will effectively bond dielectric film 10 to chip 21 so that adhesion layer 20 is no longer required.

Adhesion layer 20 may comprise any removable adhesion material which will provide suitable temporary adhesion, allow for the desired sidewall structure of through holes 11 between dielectric film 10 and the contact pads of chip 21, and which is otherwise suitable for use in power packaging structures. Examples of suitable materials include polyesters, solder resists, polyimides, silicone and epoxies. In one embodiment, adhesion layer 20 may be a thermoset, a thermoplastic, or a blend of thermosets and thermoplastics. One example of an acceptable thermoplastic is ULTEM™ polyetherimide resin (ULTEM is a trademark of General Electric Company).

The thickness of the adhesion layer may be any desired thickness which will provide suitable adhesion and will allow for the vertical height of the chip contact pads 22 and 23. For example, the adhesion layer may be in a range of less than about 0.2 mils thick, from about 0.2 mils to about 0.5 mils thick, from about 0.5 mils to about 1.0 mils thick, from about 1.0 mils thick to about 1.5 mils thick, from about 1.5 mils to about 2.0 mils thick, from about 2.0 mils to about 3.5 mils thick, from about 3.5 mils to about 5.0 mils thick, and all subranges therebetween.

Adhesion layer 20 may be applied to the surface of the dielectric film 10 by any suitable method. For example, the adhesion layer 20 may be applied by meniscus coating, spray coating, vacuum deposition, or lamination techniques. In one embodiment, adhesion layer 20 comprises a polyetherimide resin laminated in a vacuum chamber.

In the embodiment illustrated in FIGS. 1, 2 and 3, adhesion layer 20 is applied to dielectric film 10 after through holes 11 are formed. In an alternative embodiment, adhesion layer 20 is applied to the surface of dielectric film 10 before through holes 11 are formed. Through holes 11 are then formed through both dielectric film 10 and adhesion layer 20 using any suitable technique, such as the mechanical drilling, laser drilling, or chemical etching techniques mentioned above. In this embodiment, through holes 11 may be formed either before or after dielectric film 10 is adhered to chip 21.

After adhesion layer 20 is applied, active surface 24 of chip 21 is brought into contact with adhesion layer 20 so that through holes 11 are aligned with contact pads 22 and 23, as shown in FIG. 3. In one exemplary embodiment, chip 21 is positioned onto adhesion layer 20 using a pick and place machine. Chip 21 is then bonded to dielectric film 10. In one embodiment, bonding may be accomplished by heating or otherwise curing adhesion layer 20 by any suitable method. In one embodiment, the heating step is performed in a vacuum oven to prevent the formation of vapor pockets within adhesion layer 20.

In one embodiment, adhesion layer 20 is a thermoplastic, and bonding is accomplished by raising the temperature until sufficient flow has occurred in the thermoplastic to allow bonding to occur. In another embodiment, adhesion layer 20 is a thermoset and bonding is accomplished by raising the temperature of the adhesion layer until cross-linking has occurred.

In the embodiment where adhesion layer 20 is a thermoset, bonding may be accomplished by fully cross-linking the thermoset material to form the desired bond. However, generally adhesion layer 20 will be more difficult to remove after full cross-linking has occurred. Accordingly, in one alternative embodiment, the thermoset material is only partially cured by raising the temperature of adhesion layer 20 to remove volatiles, and then lowering the temperature of adhesion layer 20 before significant cross-linking occurs. This will allow the temporary adhesion layer to be more easily removed later in the process. In certain embodiments it may be desirable to continue heating adhesion layer 20 until partial, but not full, cross-linking has occurred in order to form a bond strong enough to allow chip 21 to remain bonded to dielectric film 10 during the fabrication process until conductive layer 40 is formed, while still allowing for relatively easy removal of adhesion layer 20.

In yet another embodiment, a single layer may function as both dielectric film 10 and adhesion layer 20. For example, a single thermoplastic layer, such as for example ULTEM™ polyetherimide resin, may be employed as both the dielectric film 10 and the adhesion layer. Although this embodiment may use a higher bonding temperature to bond chip 21 to dielectric film 10 when compared with the process utilizing a separate adhesion layer 20, it has the advantage of using a single layer to replace two separate layers, thereby reducing the number of materials and processing steps involved and saving time and/or expense.

Figure 5:
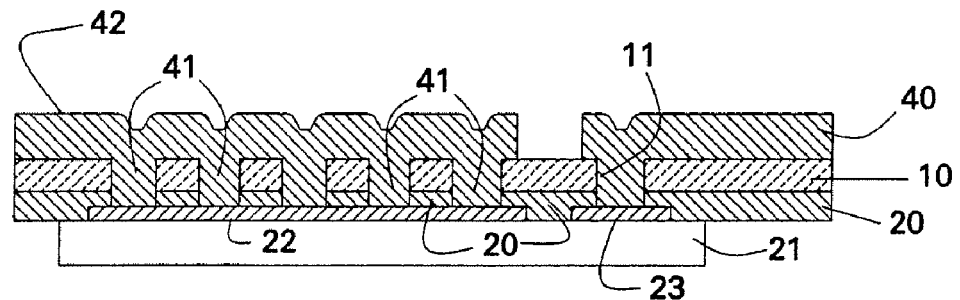
FIG. 5 is a cross-sectional view of the packaging structure of FIG. 4 after a conductive layer is formed adjacent to the dielectric film and into the through holes to make electrical contact with the power semiconductor chip, according to one embodiment of the present application.

FIG. 5 illustrates a cross-sectional view of chip 21 attached to dielectric film 10 after conductive layer 40 has been formed. Dielectric film 10 provides a planar surface on which conductive layer 40 may be formed, resulting in a planar interconnect structure on the upper surface of dielectric film 10. Conductive layer 40 fills through holes 11 to form conductive posts 41, which electrically couple conductive layer 40 to contact pads 22 and 23.

Conductive posts 41 provide the necessary adhesion to hold both dielectric film 10 and conductive layer 40 to power semiconductor chip 21. In one embodiment, one or more through holes in dielectric film 10 are also formed over inactive areas of chip 21 so that additional metal posts attach to the inactive areas to provide increased mechanical adhesion.

Conductive layer 40 may comprise any conductive material suitable for use in power semiconductor device interconnects. In one embodiment, conductive layer 40 may comprise refractory metals, noble metals, or alloys of refractory and/or noble metals. Examples of such metals and metal alloys include tungsten, molybdenum, titanium/tungsten, gold, platinum, palladium, gold/indium, and gold/germanium. In another embodiment, copper, aluminum, or alloys of copper or aluminum may be employed. The material employed for the metal layer may be chosen to withstand the temperatures at which the power chip is expected to operate. For example, the metal may be chosen to withstand continuous operating temperatures above about 150° C., such as temperatures of 250° C., 300° C., 350° C., and higher. In one embodiment, copper may be employed at temperatures below about 350° C. In yet another embodiment, refractory metals, noble metals or alloys of refractory and/or noble metals, such as those listed above, may be employed at temperatures higher than about 350° C.

The desired thickness of conductive layer 40 depends upon the amount of current expected, as well as the width of the metallization runs in the patterned conductive layer. In one embodiment, the total thickness of conductive layer 40 is capable of carrying the relatively high currents typical for power chip operation with relatively low resistive losses. For example, conductive layer 40 may be formed to a thickness of from about 10 microns to about 15 microns, from about 15 microns to about 20 microns, from about 20 microns to about 50 microns, from about 50 microns to about 100 microns, from about 100 microns to about 250 microns, from about 250 microns to about 500 microns, and all subranges therebetween.

In one embodiment conductive posts 41 fill through holes 11, as depicted in FIG. 5. However, depending on the size of through holes 11 and the thicknesses of dielectric layer 10 and adhesive layer 20, conductive posts 41 may be more conformal to the though hole so as to cover the through hole side walls and the chip contact pads 22 and 23 and only partially filling through holes 11.

Conductive layer 40 may be formed by sputtering, chemical vapor deposition, electroless plating, or any other suitable methods. In one embodiment, conductive layer 40 comprises a single layer. In an alternative embodiment, conductive layer 40 comprises multiple layers. For example, conductive layer 40 may comprise a thin metal seed layer and a thicker metal layer formed on the seed layer. In yet other embodiments, the conductive layer 40 may comprise a barrier metal layer and/or an adhesion layer. Examples of materials which may be employed as adhesion layers include titanium, gold, and tungsten. Combinations of these layers may also be employed to provide the desired adhesion, such as for example, a layer of gold on a layer of tungsten. In one embodiment, a thin layer of titanium may function as both a barrier layer and an adhesion layer. Other suitable barrier and/or adhesion layers may be employed in place of or in addition to the materials listed above.

Figure 24:
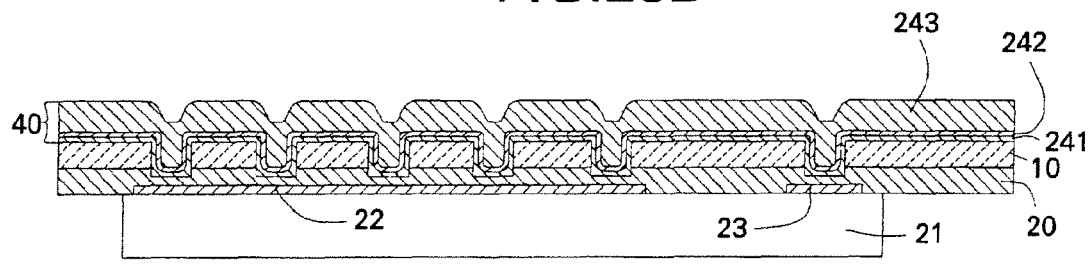
FIG. 24 is a cross-sectional view of the packaging structure of FIG. 5 depicting a multiple layer conductive layer that is formed adjacent to the dielectric film and into the through holes to make electrical contact with the power semiconductor chip, according to one embodiment of the present application.

For example, in one embodiment, as illustrated in FIG. 24, a multiple layer conductive layer 40 is formed using a sputter/electroplate process. The first step in this process is to apply a relatively thin barrier metal layer 241 by a sputter process over the top surface of the dielectric film 10, including on to the sidewalls of through holes 11 and on portions of contact pads 22 and 23 exposed at the bottom of through holes 11. Barrier metal layer 241 may comprise any suitable barrier metal, such as, for example, titanium. Barrier metal layer 241 may be formed to a thickness of, for example 500 to 5000 angstroms, and all subranges therebetween. A seed layer 242 is then formed on barrier metal layer 241 by sputtering, followed by depositing a thicker metal layer 243 by electroplating. Seed layer 242 is generally made of the material which will be deposited in the electroplating step, although any seed layer which will provide for the desired nucleation to occur during electroplating could be employed. For example, a seed layer 242 of copper may be deposited to a thickness ranging from 2000 angstroms to about 400 nanometers, from about 400 nanometers to about 600 nanometers, from about 600 nanometers to about 800 nanometers, from about 800 nanometers to about 1 micron, and all subranges therebetween, followed by electroplating additional copper to form layer 243 to the desired thickness of, for example, from 25 to 50 microns, from 50 to 100 microns, from 100 to 200 microns, and all subranges therebetween.

In yet another embodiment, the barrier layer is not employed. Instead, a copper seed layer is formed directly on dielectric film 10 by sputtering or electroless plating, followed by electroplating additional copper to the desired thickness, as described above.

Figure 6:
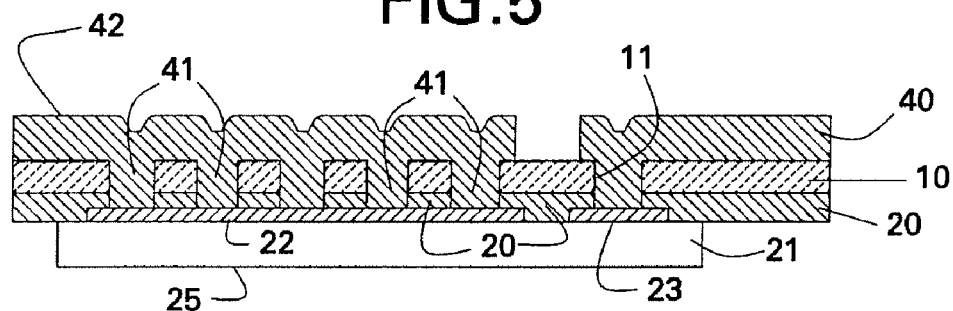
FIG. 6 is a cross-sectional view of the packaging structure of FIG. 5 after the conductive layer is patterned, according to one embodiment of the present application.

FIG. 6 illustrates a cross-sectional view of chip 21 attached to dielectric film 10 after conductive layer 40 is patterned. Conductive layer 40 is patterned by selectively removing portions of the conductive layer to form packaging structure interconnects. The resulting interconnect structure comprising conductive posts 41 and wiring 42 formed adjacent to the upper surface of dielectric film 10 can provide low resistance and low inductance interconnections for high currents often present in power semiconductor devices.

Conductive layer 40 may be patterned by any suitable method. Metallization patterning can be controlled precisely using, for example, a technique known as adaptive lithography that is described in Eichelberger et al., U.S. Pat. No. 4,835,704. The description of adaptive lithography found in Eichelberger is incorporated herein by reference. Conventional patterning and etching techniques, such as subtractive etching, may be employed. For example, a photomask material may be applied over the surface of conductive layer 40, followed by photodeveloping the photomask material into the desired interconnect pattern, and then etching the exposed portions of conductive layer 40 using a standard wet etch bath.

In an alternative embodiment, conductive layer 40 may be formed by semi-additive processing techniques, which are also well known in the art. For example, a thin metal seed layer may be formed on dielectric film 10. A photomask material is applied over the surface of the thin metal seed layer, followed by photodeveloping the photomask material so that the thin metal seed layer is exposed where the desired interconnect pattern is to be formed. An electroplating process is then employed to selectively deposit additional metal on the exposed seed layer to form a thicker layer, followed by removing the remaining photomask material and etching the exposed thin metal seed layer.

FIG. 7 illustrates a cross-sectional view of dielectric film 10 attached to chip 21, which is aligned to a power module substrate 70. Power module substrate 70 comprises an insulating substrate 71 having one or more electrically conductive substrate contacts 72 to which chip 21 may be electrically coupled, as illustrated in FIG. 8. For example, chip 21 may be soldered to substrate contact 72 with solder 74 by any suitable method. Insulating substrate 71 may also have a backside conductive layer 73, which can facilitate attachment of the power module to a heat sink (not shown) by any suitable method.

Insulating substrate 71 may comprise any insulating material suitable for use in power module substrates. Examples of such materials are inorganic insulating materials, such as ceramics, including $Al_2O_3$ and BeO, as well as other insulating materials, such as AlN, $Si_3N_4$ and SiC.

In one embodiment, insulating substrate 71 has a first major surface and an opposing second major surface, the first and second major surfaces being substantially planar. The one or more electrically conductive substrate contacts 72 are formed adjacent the first major surface, as illustrated in FIG. 7. Backside conductive layer 73 may be formed on the second major surface.

The solder 74 should be chosen to withstand the temperatures at which chip 21 will operate. For example, in certain lower temperature applications, tin lead (SnPb) solder may be employed. In one embodiment the tin lead may have a high lead content, such as 90% by weight lead. At higher temperatures, a high temperature solder, such as gold tin (AuSn), gold germanium (AuGe) or gold indium (AuIn) may be preferable. In other embodiments the solder may be chosen from tin silver copper, tin copper, and tin bismuth. Other suitable high temperature die attach techniques, such as brazing, or diffusion bonding using copper gallium, may also be employed in place of soldering.

Substrate contact 72 and backside conductive layer 73 may comprise any conductive material suitable for use in power semiconductor device contact structures. The material employed may be chosen to withstand the temperatures at which the power chip is expected to operate. In one embodiment, for example, refractory metals, noble metals or alloys comprising refractory and/or noble metals, such as tungsten, molybdenum, gold, platinum, palladium, and titanium-tungsten may be employed. In another embodiment, copper, aluminum, or alloys of copper or aluminum may be employed. For example, in one embodiment substrate contact 72 is copper and backside conductive layer 73 is copper molybdenum (CuMo).

FIG. 9A illustrates a cross-sectional view of one embodiment of a power semiconductor chip packaging structure, similar to the structure illustrated in FIG. 8, with the adhesion layer 20 removed. The removal of adhesion layer 20 may occur either before or after chip 21 is attached to power substrate 70. The removal of adhesion layer 20 results in the formation of one or more air gaps 91 between dielectric film 10 and the active surface of power semiconductor chip 21. The size of the air gaps will depend on the thickness of adhesion layer 20 which is removed. As more clearly illustrated in FIG. 9B, the air gap may be formed having a height of distance x between the dielectric film 10 and the active surface of chip 21. In one embodiment, distance x may have a height ranging from about 0.01 mil to about 0.10 mil, from about 0.10 mil to about 0.5 mil, from about 0.5 mil to about 1.0 mil, from about 1.0 mil to about 2.0 mils, from about 2.0 mils to about 3.5 mils, from about 3.5 mils to about 5 mils, and all subranges therebetween. For example, distance x may have a height ranging from about 0.2 mil to about 2 mils.

In one embodiment, lateral air gaps 92 surround at least one lateral edge of chip 21, between dielectric film 10 and substrate 70. It is to be understood that the lateral edges of the device may include additional layers, not illustrated, such as a voltage isolation dielectric, described in greater detail below. In one embodiment, air gaps 92 surround the entire periphery of one or more devices encapsulated by the packaging structure.

Figure 10:
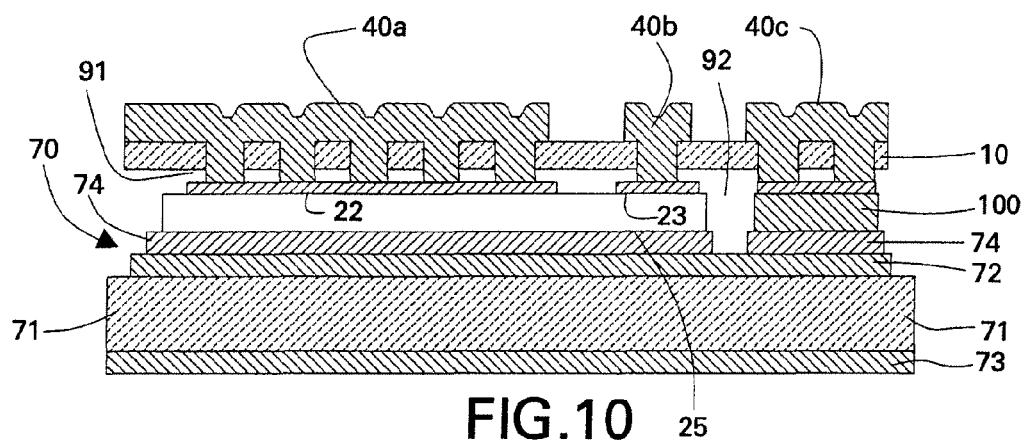
FIGS. 10 and 11 are cross-sectional views of packaging structures similar to the embodiment of FIG. 8, which include one or more conductive spacers positioned along side the power semiconductor chip between the dielectric film and the power substrate, according to embodiments of the present application.

Airgaps 92 may extend between the lateral edges of various devices in the packaging structure. For example, as seen in FIG. 10, air gap 92 extends between chip 21 and conductive spacer 100, which will be described in greater detail below. Air gaps 92 may also extend between the devices 130 and 131 and spacers 100 of the multi-chip modules illustrated in FIGS. 15 and 16, which will also be described in greater detail below.

Referring again to FIG. 9A, the removal of adhesion layer 20 will increase the temperature range at which the packaging structure may continuously be used. Generally, materials used for the adhesion layer 20 begin degrading and breaking down at relatively low temperatures, compared with the other materials used in the packaging structure of FIG. 9. For example, the adhesion layer 20 may begin to break down at a temperature of about 125° C. Thus, the removal of the adhesion layer will increase the temperature range at which the packaging structure may be continuously used to the highest temperatures below which the other materials in the packaging structure will not break down, as discussed in more detail below.

Adhesion layer 20 may be removed by any suitable method. In one embodiment, the temporary adhesion is removed by etching, such as by wet chemical etching, plasma etching, or other suitable etching techniques. In an alternative embodiment, adhesion layer 20 is removed by dissolving the layer using a solvent.

In yet another embodiment, adhesion layer 20 is removed by sublimation. In this embodiment, the materials for adhesion layer 20 may be any suitable sublimable material. Such materials may include, for example, low melt waxes, anthraquinone, sublimable derivatives of anthraquinone, such as alizarin, and other sublimable organic solids, such as adipic acid and other dicarboxylic acids. A description of other sublimable materials, many of which may be readily employed as adhesion layer 20, may be found in the Handbook of Chemistry and Physics. $60^{th}$ Ed. Pages C-722 to C-723, and the description of these sublimable materials is herein incorporated by reference.

Sublimation of adhesion layer 20 may be accomplished by any suitable method which is appropriate for sublimating the material employed and which will not damage the chip or packaging structure. Such methods are well known in the art and may include, for example, raising the temperature and/or reducing the pressure to provide the necessary conditions for sublimation to occur.

In embodiments where sublimable materials are employed for adhesion layer 20, the temperature and pressure parameters of the processing steps prior to the desired removal of the sublimable material are preferably chosen to minimize sublimation of the material.

The resulting packaging structure of FIG. 9A has a planar interconnect structure. Additionally, in the embodiment where dielectric film 10 is an inorganic material, the packaging structure contains no temperature limiting polymers or other organic materials, and thus can be operated continuously at temperatures of up to 350° C., or possibly higher.

In alternative embodiments, where dielectric film 10 comprises an organic material, the temperature at which the device may be operated continuously without incurring heat damage may depend on the particular material employed. For example, polymers, such as some polyimides, may be operated continuously at temperatures of up to about 200° C. without sustaining damage, while the high temperature polymers listed above may be used at temperatures of up to about 250° C., or possibly higher. As polymers are developed which can withstand still higher temperatures, the usable temperature range of polymers in the packaging structures of the present disclosure will increase.

FIG. 10 illustrates a cross-sectional view of one embodiment of a power semiconductor chip packaging structure having air gaps 91 formed between dielectric film 10 and power semiconductor chip 21, similar to the embodiment of FIG. 9A, except that the embodiment of FIG. 10 also includes a conductive spacer 100. Conductive spacer 100 is formed adjacent to substrate contact 72 and electrically couples the back surface 25 of chip 21 to a back surface contact 40c formed on the upper surface of dielectric film 10. This allows all power signals and controls to chip 21 to be made through contacts 40a, 40b and 40c adjacent to the active surface of chip 21. Since contacts 40a, 40b and 40c are all located on the same plane (e.g., the surface of dielectric film 10), the interconnect structure of the packaging structure may be positioned on the surface of dielectric film 10, thereby eliminating the need to form interconnects on power substrate 70. In this embodiment, insulating substrate 71 may comprise a material having a high thermal conductivity, such as, for example, SiC, in order to increase the thermal conductivity of the packaging structure's thermal path. A heat sink (not shown) may be mounted on the bottom of the power substrate, if desired, thereby providing for an increased thermally conductive thermal path.

Figure 11:
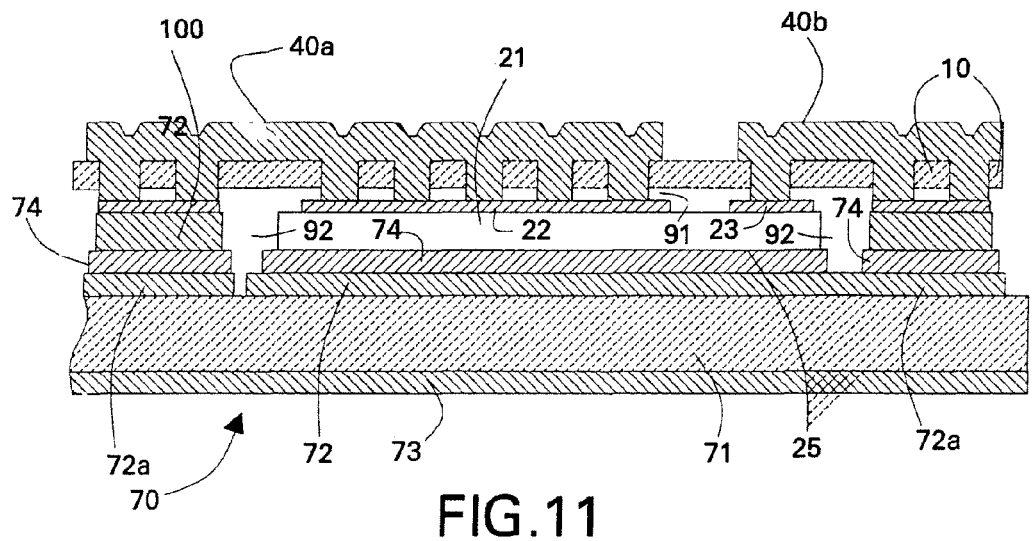

In an alternative embodiment, as depicted in FIG. 11, conductive spacers 100 can electrically couple contact pads 22 and/or 23 of chip 21 to electrically conductive substrate contacts 72a on substrate 70. This allows all of the power signals and controls to the power chip to be made through the interconnect structure adjacent to the backside surface of chip 21. Since the majority of the interconnect structure is adjacent to power substrate 70, rather than dielectric film 10, this embodiment would allow optimization of the thermal path through the materials adjacent to the active surface of chip 21, including dielectric film 10 and contacts 40a and 40b. Additionally, it would allow the possibility of mounting a heat sink (not shown) in proximity to dielectric film 10 and contacts 40a and 40b.

In one embodiment, conductive spacer 100 may have a thickness which is approximately equal to a thickness of chip 21, as illustrated in FIGS. 10 and 11. Conductive spacer 100 may be attached to the substrate contact 72 of power substrate 70 using, for example, solder attach 74, similar to the process described above in relation to FIG. 8 for attaching chip 21 to power substrate 70.

Figure 22A:
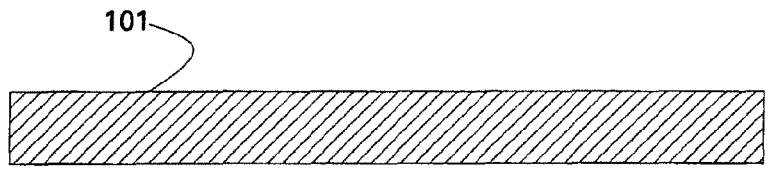
FIGS. 22A to 23B illustrate methods of forming conductive spacers, which may be used in the packaging structures illustrated in FIGS. 10 and 11, according to embodiments of the present application.
Figure 22B:
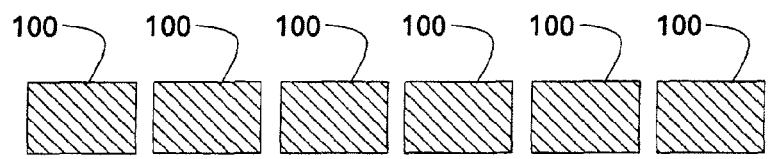

FIGS. 22A to 23B illustrate two exemplary methods of forming conductive spacers 100. In the embodiment of FIGS. 22A and 22B, conductive spacer 100 is formed out of a sheet 101 of electrically conductive material. The electrically conductive material may comprise, for example, a metal, such as Cu, Al, W or stainless steel, or a metal composite material such as Cu:Mo, Cu:Invar, Al:SiC or Graphite reinforced Al. Sheet 101, as depicted in FIG. 22A, has a thickness approximately equal to that of chip 21, as illustrated in FIG. 10. As shown in FIG. 22B, sheet 101 may be cut into individual spacers 100. Sheet 101 may be cut by any suitable, such as mechanical cutting, laser cutting or waterjet cutting.

Figure 23A:
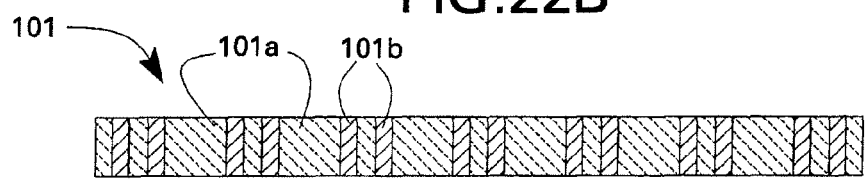
Figure 23B:
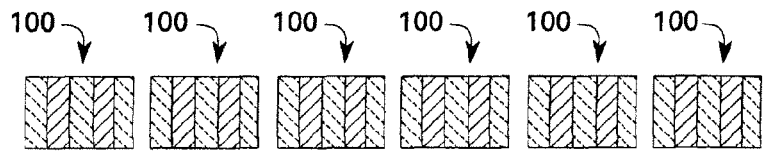

Alternatively, in the embodiment depicted in FIGS. 23A and 23B, conductive spacer 100 may be fabricated as a more complex structure, such as a plastic or ceramic material with metal feedthroughs. In this embodiment, sheet 101 is composed of nonconductive material 101a with a plurality of conductive feedthroughs 101b extending through the thickness of nonconductive material 101a. Sheet 101 is cut into multiple conductive spacers 100, each containing at least one conductive feedthrough 101b. Nonconductive material 101a may comprise an organic dielectric material, such as a filled or unfilled polymer, epoxy, silicone, or blend thereof; or an inorganic material, such as ceramic or glass. Conductive feedthroughs 101b may comprise a metal, such as Cu, Al, W or stainless steel, or a metal composite material such as Cu:Mo, Cu:Invar, Al:SiC or Graphite reinforced Al.

In one embodiment, a composite sheet 101 of FIG. 23A may be fabricated by molding nonconductive material 101a around the conductive feedthroughs 101b in either a sheet of the desired thickness or in a thick block that is later sliced into sheets of the desired thickness. Any nonconductive materials suitable for molding may be employed in this embodiment. Examples of such materials may include organic dielectric materials, such as filled or unfilled polymers, epoxy, silicone, or blends of such materials.

In one embodiment for forming conductive spacers which may be preferably employed in packaging structures used at high temperatures, the nonconductive material is inorganic, such as a ceramic or glass, and conductive feedthroughs 101b comprise refractory or noble metals, such as for example tungsten, molybdenum, titanium-tungsten, gold, platinum, palladium, gold/indium, and gold/germanium. In this embodiment, composite sheet 101 may be formed using any suitable method, such as ceramic firing methods, or known methods of melting and cooling glass.

Figure 12A:
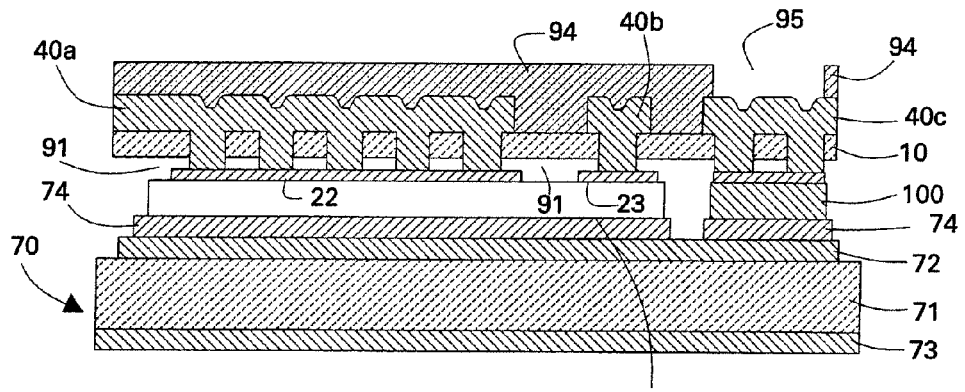
FIGS. 12A to 12C illustrate cross-sectional views of a method of forming a multi-level interconnect structure over a packaging structure similar to that illustrated in FIG. 10, according to one embodiment of the present application.
Figure 12B:
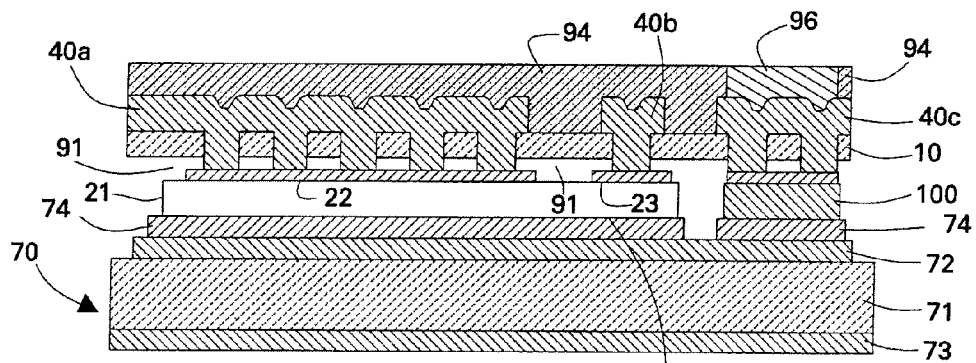
Figure 12C:
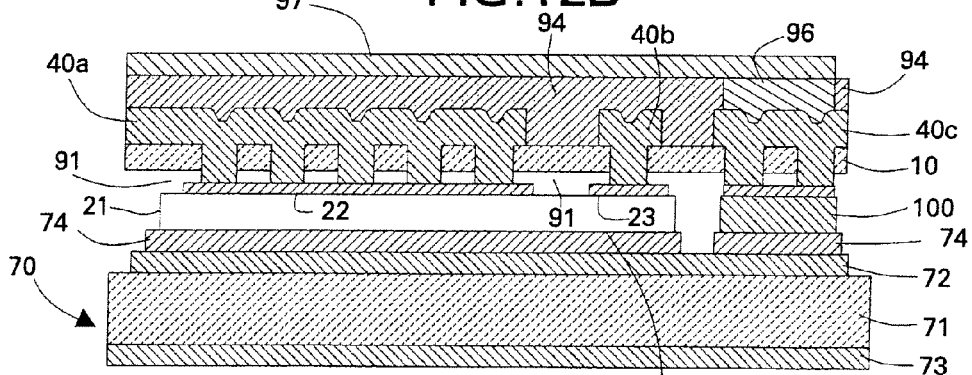

Multi-level interconnect structures, which allow the formation of more complicated interconnect circuits as part of the packaging structure, may be employed in the packaging structures of the present application. One embodiment of a multi-level interconnect structure is illustrated in FIGS. 12A to 12C. The multi-level interconnect structure comprises an interlevel dielectric layer 94, as illustrated in FIG. 12A, which is deposited over the exposed areas of dielectric film 10 and contacts 40a, 40b, and 40c. Dielectric layer 94 may comprise, for example, an inorganic dielectric, such as glass, ceramic, oxide or other suitable inorganic material that can be deposited at a temperature below that which could damage the power device or interconnect structure. Interlevel dielectric layer 94 may be formed by any suitable method, such as by coating and then etching to form one or more via holes 95 into which conductive plug 96 is formed, or by selectively depositing dielectric layer 94 over the desired regions of the top surface to leave one or more via holes 95. Conductive plug 96, illustrated in FIG. 12B, which electrically couples contact pad 40c to the top of the second dielectric layer 94, is then formed by any suitable method. As illustrated in FIG. 12C, conductive layer 97 is then disposed over portions of the top surface of dielectric layer 94, making electrical contact to conductive plug 96. Additional interlevel dielectric layers and conductive layers may be formed to provide additional interconnect levels, if the complexity of the circuit requires it. Conductive plugs may also be formed to contact pads 40a and 40b, in addition to contact pad 40c, for electrically contacting the interconnects of the multilevel interconnect structure.

Figure 13:
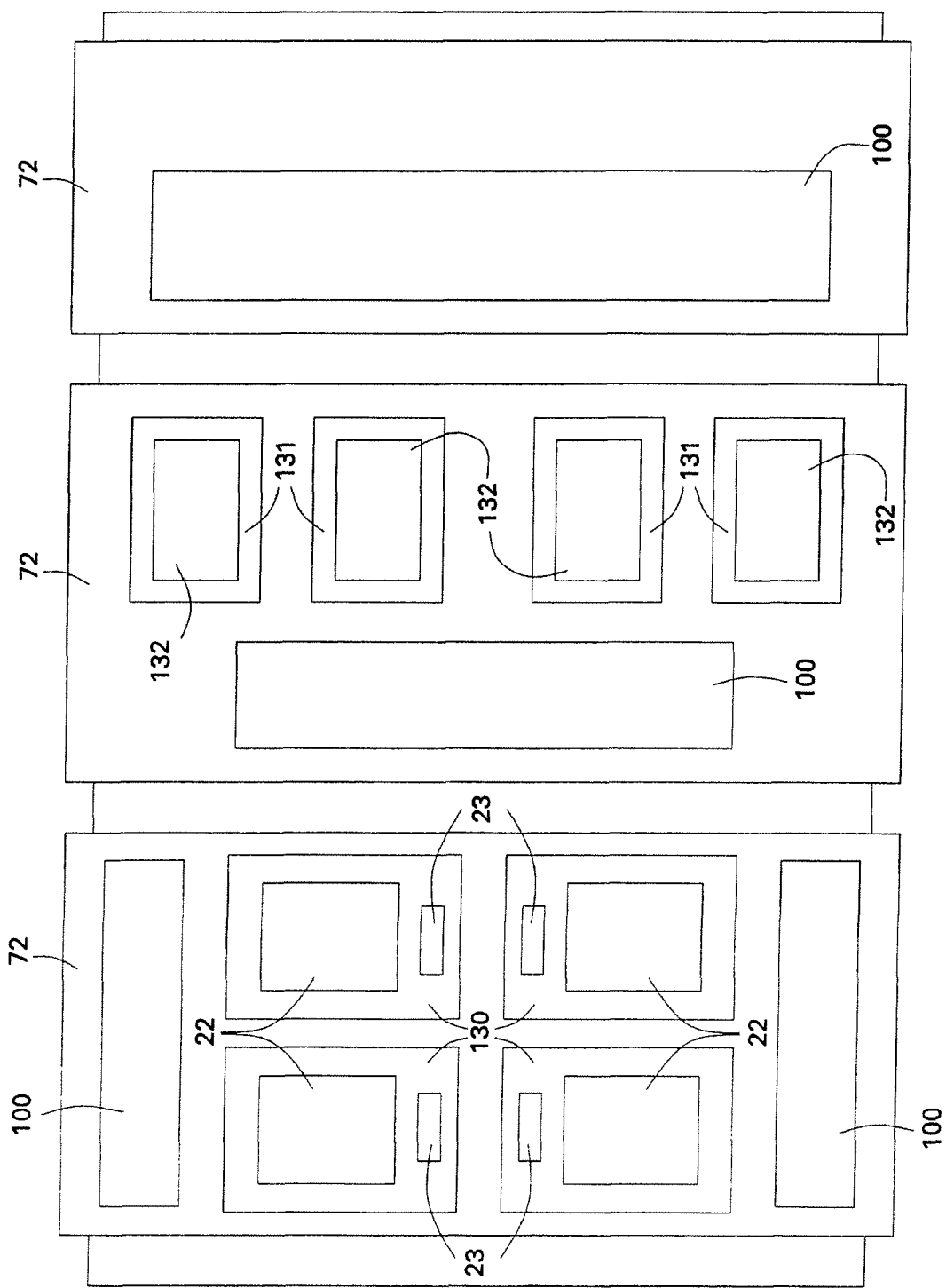

The semiconductor chip packaging structures of the present application may contain one or more power semiconductor chips. Where packaging structures are fabricated with more than one power chip, the chips may be arranged in any suitable configuration to provide the desired circuitry. For example, FIG. 13 illustrates a top view of one embodiment of a multi-chip power module (dielectric film 10 and patterned conductive layer 40 are not illustrated for clarity) having more than one power semiconductor chip. The module includes FETs 130 having gate contact pads 23 and source contact pads 22, as well as diodes 131 having source contacts 132. The module also includes conductive spacers 100.

FIGS. 14 to 16 illustrate top and side views of the interconnect structure for the multi-chip power module of FIG. 13. Conductive posts 41 electrically couple patterned conductive layer 40 on the upper surface of dielectric film 10 with the various chips in the module.

In the embodiment illustrated in FIG. 14, I/O straps 151 are employed to provide a means for electrically connecting the power module to, for example, a circuit board. In one embodiment, as more clearly illustrated in FIG. 15, straps 151 are extensions of substrate contacts 72, the straps and the contacts being formed from the same piece of conductive material. In this embodiment, straps 151 may be formed by any suitable method. For example, the conductive material forming straps 151 and contacts 72 may be bent into the desired shape prior to attachment to substrate 71 by controlling the radius of curvature using standard metal bending methods. Alternatively, the material forming straps 151 and contacts 72 may be applied to the substrate in a flat form and bent to the desired form after attachment. This latter method simplifies the attachment process, but care should be taken not to stress the strap-to-substrate bond. In yet another embodiment, straps 151 and contacts 72 are formed separately by, for example, forming contacts 72 on substrate 71, and then attaching straps 151 to contacts 72 by any suitable method, such as soldering, brazing or welding.

In other embodiments, straps 151 may be extensions of conductive layer 40, the straps 151 and the contacts 40 being formed from the same piece of conductive material by methods similar to those described in the preceding paragraph. Alternatively, straps 151 may be attached to conductive layer 40, by, for example, soldering, brazing or welding. In yet other embodiments, the I/O structure may include one or more I/O straps which are attached to, or are extensions of, substrate contacts 72, and one or more I/O straps which are attached to, or are extensions of, conductive layer 40.

Other suitable I/O structures and techniques may also be employed, including, but not limited to, pressure contact techniques or direct solder attach to an interconnect structure, such as a printed circuit board or a ceramic substrate. As is well known in the art, the I/O structure is generally selected based upon the system level requirements of the particular power circuit application.

FIGS. 13 to 16 are directed to one example of a possible multi-chip configuration for a power module, and one of ordinary skill in the art would readily understand that many other alternative configurations are possible. One of ordinary skill in the art would also understand that the multi-chip power modules of the present application may be configured to form any desired power devices, such as power switches, power half bridges, power bridges, power rectifiers, and complex power functions.

In one embodiment, the power module may be mounted into a hermetic enclosure forming a hermetically sealed power module. One exemplary hermetic enclosure which may be used is a ceramic package with sealed electrically conductive leads forming electrical connections to the module interconnects. Methods and structures for providing such hermetically sealed enclosures are well known in the art.

Figure 17:
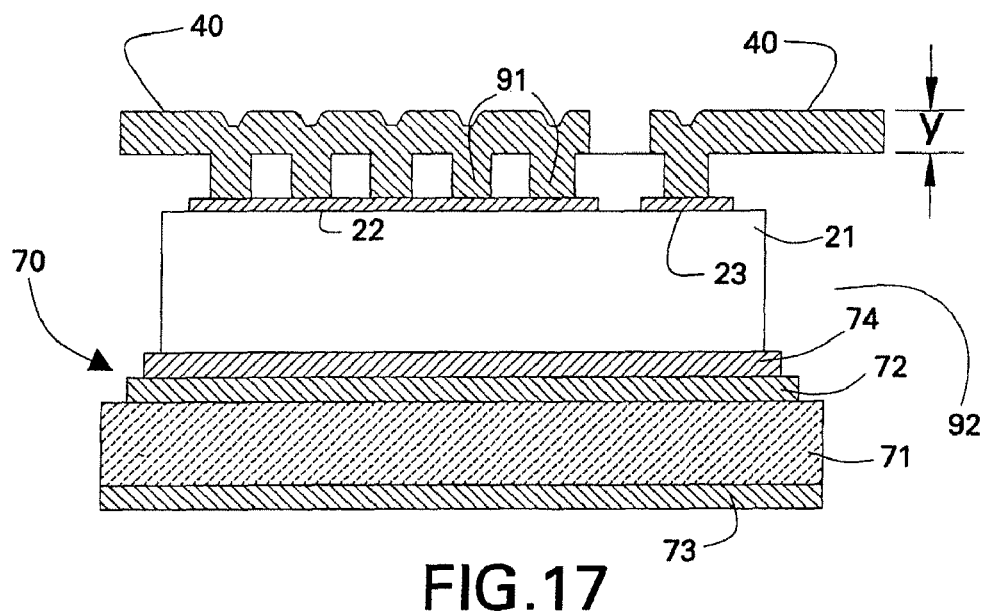
FIG. 17 illustrates a cross-sectional view of a packaging structure similar to the embodiment illustrated in FIG. 9, except that the dielectric film has been removed, according to a further embodiment of the present application.

FIG. 17 illustrates a cross-sectional view of another embodiment of the present application which is similar to the embodiment of FIG. 9A, except that dielectric film 10 has been removed, leaving air gaps 91. The height y of air gaps 91 in this embodiment is approximately equal to the combined thickness of adhesion layer 20 and dielectric film 10, which may range from about 25 to about 100 microns. In this embodiment, air gaps function as a dielectric in place of the dielectric film 10.

Since dielectric film 10 is to be removed in this embodiment, the material for dielectric film 10 may be any removable material which is stable at the processing temperatures and environmental conditions that dielectric film 10 will be subjected to during module fabrication. The material of dielectric film 10 may be chosen so as to be relatively easy to remove. For example, dielectric film 10 in this embodiment may be an organic film, such as any of the organic films listed above for dielectric film 10 in the description of the embodiment of FIGS. 1-9B. Some examples of materials for this embodiment include BT (bismaleimide-triazine) resin, manufactured by Mitsubishi Gas Chemical, as well as dissolvable materials, such as polyester, solder resist, or ULTEM™ polyetherimide (ULTEM is a trademark of General Electric Company).

The method for forming the embodiment of FIG. 17 is similar to the method described above with respect to FIGS. 1 to 9B, except that dielectric film 10 is removed. In one embodiment, dielectric film 10 may be removed in the same step as adhesion layer 20. In an alternative embodiment, dielectric film 10 may removed in a separate step than that of adhesion layer 20. Dielectric film 10 may be removed by any suitable method. For example, the removal process may be accomplished by etching dielectric film 10 using wet chemical etching or plasma etching techniques.

Alternatively, where dielectric film 10 is a dissolvable material it may be removed by dissolution in a solvent. For example, when dielectric film 10 is a polyetherimide resin, it may be dissolved using one or more solvents chosen from methylene chloride, anisole, n-methyl-pyrrolidone, acetophenone, ortho-dichloro benzene, cresol, cresylic acid, and concentrated sulfuric acid. The reactivity of the polymer layer in solvent is typically increased by heating, so it may be useful to apply the solvent using, for example, a hot spray technique.

In an alternative embodiment, dielectric film 10 is removed by sublimation. In this embodiment, the materials for dielectric film 10 may comprise any suitable sublimable material. Such materials may include, for example, low melt waxes, anthraquinone, sublimable derivatives of anthraquinone, such as alizarin, and other sublimable organic solids, such as adipic acid and other dicarboxylic acids. A description of other sublimable materials, many of which may be readily employed as dielectric film 10, may be found in the Handbook of Chemistry and Physics, 60th Ed., pages C-722 to C-723, and the description of these sublimable materials is herein incorporated by reference.

Sublimation may be accomplished by any method which is appropriate for sublimating the material employed and which will not damage the chip or packaging structure. Such methods are well known in the art and may include, for example, raising the temperature and/or reducing the pressure to provide the necessary conditions for sublimation to occur.

In embodiments where sublimable materials are employed for dielectric film 10, the temperature and pressure parameters of the processing steps employed prior to the desired removal of the sublimable material are preferably chosen to minimize sublimation of the material.

Figure 18:
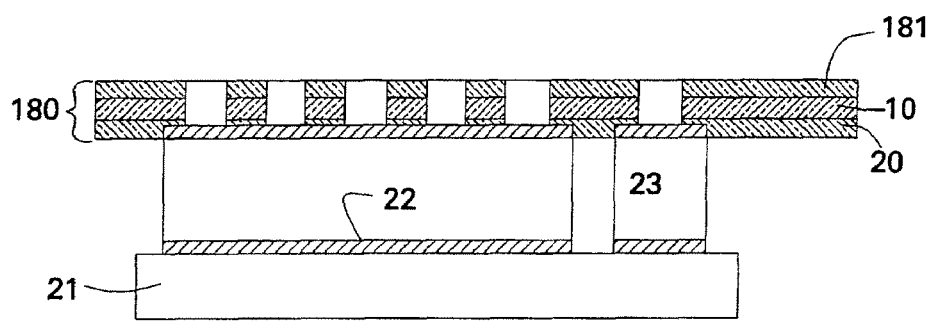
FIGS. 18 to 20 illustrate cross-sectional views of a method of forming a packaging structure according to another embodiment of the present application, which is similar to the embodiment of FIGS. 3, 6 and 9, except that a second dielectric film is formed on the first dielectric film prior to forming the conductive layer, and both the adhesion layer and the first dielectric film are subsequently removed.
Figure 19:
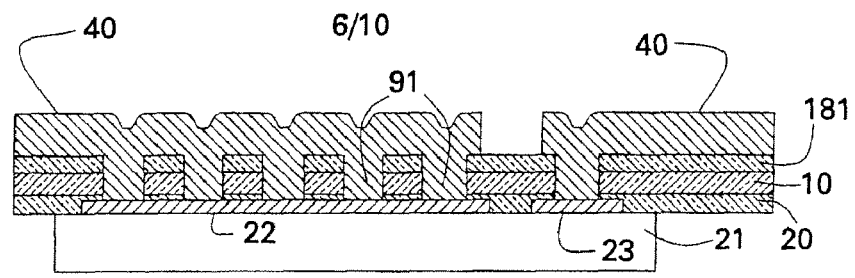
Figure 20:
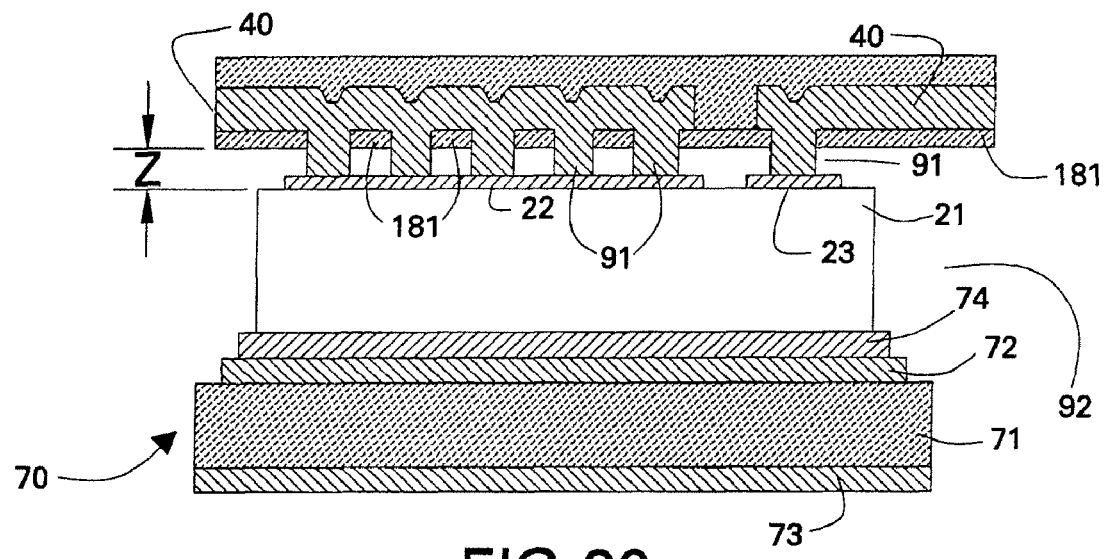

FIGS. 18-20 illustrate cross-sectional views of yet another embodiment for forming a packaging structure, which is similar to that described above in connection with FIGS. 1 to 9B, except that a multi-layer dielectric 180 is employed instead of a single dielectric film 10. FIG. 20 further shows a voltage isolation layer 190, which is described in greater detail below. However, it is to be understood that other structures may be formed in place of voltage isolation layer 190, such as the multi-level interconnect structure described above with reference to FIGS. 12A to 12C.

Referring to FIG. 18, multi-layer dielectric 180 comprises both dielectric film 10 and a dielectric film 181. As illustrated in FIG. 20, dielectric film 10 is eventually removed, while dielectric film 181 remains in place, covering the surface of conductive layer 40 proximate the active surface of chip 21, thereby providing protection from air dielectric breakdown. Both dielectric films 181 and 10 may be chosen to allow for selective removal of dielectric film 10. In addition, dielectric film 181 may be chosen to comprise a material which will withstand the continuous temperatures at which chip 21 will operate.

In one embodiment, dielectric film 10 may comprise an organic material and dielectric film 181 may comprise an inorganic material. Examples of organic materials which may be employed as dielectric film 10 in this embodiment include any of the organic materials described herein above for use as dielectric film 10, including, for example, polyimides, such as KAPTON, (a trademark of E.I. DuPont de Nemours and Co); Thermosets; Thermoplastic Resins, such as ULTEM™ polyetherimide (ULTEM is a trademark of General Electric Company); BT (bismaleimide-triazine) resin, manufactured by Mitsubishi Gas Chemical; polyester; solder resist; high temperature polymers such as polyquinoline, polyquinoxaline, and polyetherkeytone; epoxies; and silicone based materials. Examples of inorganic materials which may be employed as dielectric film 181 include any of the inorganic materials described herein above for use as dielectric film 10, including, for example, glass or ceramic materials, such as $Al_2O_3$; BeO; $Si_3N_4$; AlN; SiC; AlGaN, InGaN; gallium nitride; diamond, such as diamond films deposited by low temperature deposition techniques; diamond-like carbons, such as Dylyn, which is made by Advanced Refractory Technologies of Buffalo, N.Y.; and polysilicon.

Referring to FIG. 18, adhesion layer 20 is applied to the surface of dielectric film 10 of the multi-layer dielectric 180. Then, as illustrated in FIG. 19, a conductive layer 40 is formed, followed by patterning conductive layer 40, similarly as described above in connection with FIGS. 5 and 6. Adhesion layer 20 and dielectric film 10 are removed, leaving layer 181 under patterned conductive layer 40, to produce the packaging structure illustrated in FIG. 20. The removal of adhesion layer 20 and dielectric film 10 may occur either before or after chip 21 is attached to power substrate 70, the attaching process being similar to the attaching process described above in connection with FIGS. 6 to 8.

Adhesion layer 20 and dielectric film 10 may be removed in the same step or in separate steps. Adhesion layer 20 and dielectric film 10 may be removed by any suitable method, such as etching, dissolution in a solvent, or sublimation, as disclosed above for removing dielectric film 10 in FIG. 17. The removal steps employed in this embodiment are chosen to allow dielectric film 181 to remain. Thus, for example, where etching is used, the etching process preferably selectively etches the dielectric film 10, as compared to dielectric film 181.

Where dielectric film 10 is removed by sublimation, any of the sublimable materials and methods for sublimation which are described herein above for forming and removing dielectric film 10 in the description of the embodiment of FIG. 17 may be employed. In this embodiment, dielectric film 181 may be chosen to be any suitable dielectric material which will not be removed or otherwise damaged by the conditions necessary to sublimate dielectric film 10, such as, for example, any of the organic materials and inorganic materials previously taught for use as dielectric film 10, other than the sublimable materials.

In the packaging structure of FIG. 20, both dielectric film 181 and air gaps 91 function to provide the desired electrical insulation between conductive layer 40 and chip 21. Accordingly, both the height z of air gaps 91 and the thickness of dielectric film 181, combined, may be chosen to provide the desired electrical insulation, given the breakdown characteristics of dielectric film 181 and the applied voltages. The existence of dielectric film 181 may help provide protection against air dielectric breakdown, which may occur in, for example, high moisture environments.

Figure 21:
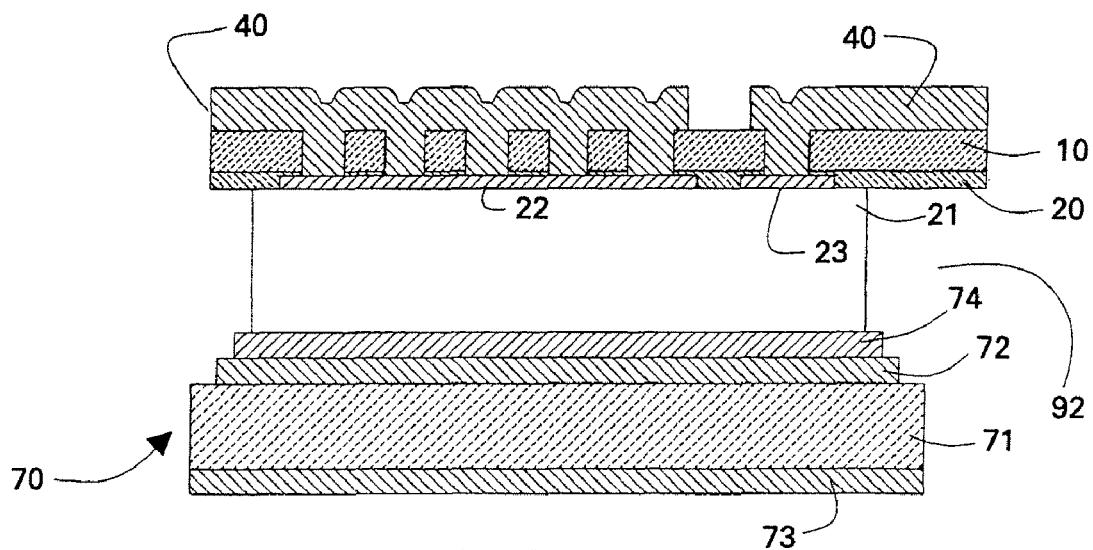
FIG. 21 illustrates a cross-sectional view of a packaging structure similar to that of FIG. 8, except that the adhesion layer has been structurally changed into a high temperature stable glass, according to a further embodiment of the present application.

FIG. 21 illustrates a cross-sectional view of yet another embodiment which is similar to the embodiment described above in connection with FIGS. 1 to 9B, except that instead of removing adhesion layer 20, the adhesion layer 20 is converted into a material which is stable at relatively high temperatures. For example, adhesion layer 20 may be applied as an organic material that is subsequently converted to a substantially inorganic material, such as glass. An example of one type of material which may be employed is an inorganic-organic hybrid polymer, such as ORMOCER® (trademark of the Fraunhofer-Gesellschaft zur Förderung der angewandten Forschung e.V. München). ORMOCER material can be applied by spin coating or other liquid dispensing techniques onto dielectric film 10 and partially cured to form adhesion layer 20. Following placement of chip 21 onto the ORMOCER adhesion layer 20, the temperature of the packaging structure is raised to the cure point of the ORMOCER, which is about 170° C. without hardeners and about 70° C. with hardeners. The material cross links into a hermetic, inorganic or substantially inorganic structure that can withstand 300° C. or higher environments. The phrase "substantially inorganic" means that the layer mainly comprises a network of inorganic structural units, although some organic functional groups and/or organic crosslinking units may remain. For example, after the inorganic-organic hybrid polymer is cured, it may comprise 10% by weight or less of organic structural units.

The above-described packaging structures of the present application result in a patterned conductive layer 40 which is relatively easy to coat with dielectrics to achieve voltage isolation, as compared to wire bonds which are traditionally used in packaging. To provide voltage isolation in the packaging structures of the present application, a voltage isolation dielectric layer may be formed adjacent to patterned conductive layer 40, as well as other voltage sensitive areas, such as exposed portions of substrate contact 72, solder attach 74 and voltage sensitive areas of chip 21. For example, referring back to the embodiment of FIG. 20, voltage isolation layer 190 is formed adjacent to the patterned conductive layer 40 and portions of the exposed top surface of dielectric layer 181. While voltage isolation layer 190 is only illustrated in connection with the embodiment of FIG. 20, it is to be understood that such voltage isolation layers may be employed in all of the packaging structures disclosed in the present application.

In one embodiment, the voltage isolation dielectric layer may comprise an inorganic material, such as diamond-like carbon (DLC), aluminum oxide, ceramic composites, glass, gallium nitride and oxides and nitrides. One example of a DLC layer which may be employed as a voltage isolation dielectric is DYLYN, which is made by Advanced Refractory Technologies of Buffalo, N.Y. DYLYN has coupling materials such as silanes that chemically grip native oxides, thus allowing for good adhesion. Other dielectric materials suitable for providing voltage isolation may be employed. In one embodiment, dielectric materials having relatively low CTEs may be employed to prevent undesirable thermal stress on the devices and/or packaging structures. The voltage isolation dielectric layer may be deposited by any suitable method, such as, for example, chemical vapor deposition or plasma enhanced chemical vapor deposition.

In one embodiment, an adhesion layer is deposited prior to depositing the voltage isolation dielectric layer in order to increase the adhesion of the dielectric layer to the underlying conductive layer 40, as well as to other exposed surfaces of the packaging structure on which the voltage isolation dielectric layer may be formed. The adhesion layers may have any suitable thickness which will provide the desired adhesion. For example, the adhesion layers may have a thickness ranging from about 50 angstroms to about 100 angstroms, from about 100 angstroms to about 250 angstroms, from about 250 angstroms to about 500 angstroms, from about 500 angstroms to about 1000 angstroms, from about 1000 angstroms to about 2000 angstroms, and all subranges therebetween. Examples of materials which may be employed as the adhesion layer include gold, molybdenum and titanium/tungsten. Methods for forming such adhesion layers are well known in the art.

Of course, it is to be understood that not necessarily all objects or advantages described above may be achieved in accordance with any particular embodiment. Thus, for example, those skilled in the art will recognize that the systems and techniques described herein may be embodied or carried out in a manner that achieves or optimizes one advantage or group of described advantages as taught herein without necessarily achieving other objects or advantages as may be taught or suggested herein.

Furthermore, the skilled artisan will recognize the interchangeability of various features from different embodiments. Similarly, the various features described, as well as other known equivalents for each feature, can be mixed and matched by one of ordinary skill in this art to construct variations of these techniques and systems in accordance with principles of this disclosure.

Where necessary, ranges have been supplied, those ranges are inclusive of all sub-ranges there between. It is to be expected that variations in these ranges will suggest themselves to a practitioner having ordinary skill in the art and where not already dedicated to the public, those variations should where possible be construed to be covered by the appended claims. It is also anticipated that advances in science and technology will make equivalents and substitutions possible that are not now contemplated by reason of the imprecision of language and these variations should also be construed where possible to be covered by the appended claims.

While the techniques and systems herein have been described herein in connection with certain embodiments and detailed descriptions, it will be clear to one skilled in the art that modifications or variations of such details can be made without deviating from their general concepts. Thus the invention is to be limited by the claims that follow, and not by the embodiments and detailed description provided above.

What is claimed is:

1. A method of fabricating a power semiconductor chip packaging structure, comprising:
    providing a dielectric film having a first surface and a second surface;
    providing at least one power semiconductor chip with an active surface and an opposing back surface, the chip having one or more contact pads on the active surface;
    applying an adhesion layer adjacent to the first surface of the dielectric film;
    adhering the dielectric film to the active surface of the at least one power semiconductor chip by bringing the active surface into physical contact with the adhesion layer;
    forming a patterned electrically conductive layer adjacent to the second surface of the dielectric film, the conductive layer extending through one or more through holes formed in the dielectric film in order to form electrical contact with the one or more contact pads; and
    removing the adhesion layer to form one or more air gaps between the dielectric film and the active surface of the at least one power semiconductor chip.

2. The method of claim 1, in which the one or more through holes are formed prior to applying the adhesion layer to the dielectric film.

3. The method of claim 1, in which the one or more through holes are formed after applying the adhesion layer to the dielectric film.

4. The method of claim 1, in which the dielectric film is an inorganic dielectric.

5. The method of claim 1, in which the dielectric film comprises a material chosen from $Al_2O_3$, BeO, $Si_3N_4$, AlN or SiC.

6. The method of claim 1, wherein the dielectric film is a ceramic, and the through holes are formed while the dielectric film is in a pre-fired state.

7. The method of claim 1, wherein the dielectric film is a ceramic, and the through holes are formed after the dielectric film has been fired.

8. The method of claim 1, in which the dielectric film comprises an organic material.

9. The method of claim 1, in which the dielectric film is a polymer stable for continuous use at temperatures above 150° C.

10. The method of claim 1, in which the dielectric film comprises a material chosen from polyimide, polyquinoline, polyquinoxaline, or polyetherkeytone.

11. The method of claim 1, in which the adhesion layer is a thermoset, a thermoplastic, or a blend of thermosets and thermoplastics, and the adhering step further comprises heating the adhesion layer.

12. The method of claim 1, in which the adhesion layer is a thermoset and the adhering step further comprises heating the adhesion layer under conditions which do not cause significant cross-linking to occur.

13. The method of claim 1, in which the adhesion layer is removed by chemical etching.

14. The method of claim 1, in which the adhesion layer is a sublimable material, which is removed by sublimation.

15. The method in claim 14, in which the sublimable material is chosen from low melt waxes, anthraquinone, sublimable derivatives of anthraquinone, or dicarboxylic acids.

16. The method of claim 14, in which the sublimable material is chosen from alizarin or adipic acid.

17. The method of claim 1, in which the adhesion layer is removed by dissolving the adhesion layer in a solvent.

18. The method of claim 1, further comprising removing the dielectric film.

19. The method of claim 18, wherein the dielectric film is removed by etching.

20. The method of claim 18, wherein the dielectric film is removed by sublimation.

21. The method of claim 18, in which the dielectric film is removed by dissolving the dielectric film in a solvent.

22. The method of claim 1, further comprising
    forming a second dielectric film adjacent to the second surface of the first dielectric film to provide a multi-layer dielectric prior to forming the conductive layer, so that the conductive layer is formed adjacent to the second dielectric film of the multi-layer dielectric during the forming step; and
    removing the first dielectric film in addition to removing the adhesion layer to form the one or more air gaps, the second dielectric film remaining as part of the packaging structure after the first dielectric film is removed.

23. The method of claim 1, further comprising coupling the back surface of the at least one power semiconductor chip to a power module substrate to form a power module.

24. The method of claim 1, further comprising
providing at least one conductive spacer having a first and second surfaces;
adhering the dielectric film to the first surface of the at least one conductive spacer by bringing the first surface of the conductive spacer into physical contact with the adhesion layer;
forming the patterned electrically conductive layer so that the conductive layer extends through one or more through holes formed in the dielectric film in order to form electrical contact with the conductive spacer; and
forming one or more air gaps between the dielectric film and the top surface of the at least one conductive spacer during the removing step.

25. A method of fabricating a power semiconductor chip packaging structure, comprising:
providing a dielectric film having a first surface and a second surface;
providing at least one power semiconductor chip with an active surface and an opposing back surface, the chip having one or more contact pads on the active surface;
applying an adhesion layer adjacent to the first surface of the dielectric film, the adhesion layer comprising a first material;
adhering the dielectric film to the active surface of the at least one power semiconductor chip by bringing the active surface into physical contact with the adhesion layer;
forming a patterned electrically conductive layer adjacent to the second surface of the dielectric film, the conductive layer extending through one or more through holes formed in the dielectric film in order to form electrical contact with the one or more contact pads; and
converting the adhesion layer to a second material which can withstand continuous operating temperatures of about 300° C. or greater.

26. The method of claim 25, wherein the first material is an inorganic-organic hybrid polymer.

27. The method of claim 26, wherein converting step comprises curing the inorganic-organic hybrid polymer to convert it to either an inorganic or a substantially inorganic material.

* * * * *

UNITED STATES PATENT AND TRADEMARK OFFICE
CERTIFICATE OF CORRECTION

| | | |
|---|---|---|
| PATENT NO. | : 7,829,386 B2 | Page 1 of 1 |
| APPLICATION NO. | : 11/846024 | |
| DATED | : November 9, 2010 | |
| INVENTOR(S) | : Fillion et al. | |

It is certified that error appears in the above-identified patent and that said Letters Patent is hereby corrected as shown below:

Page 2, item (56), under "OTHER PUBLICATIONS", in Column 2, Line 1, delete "Welling" and insert -- Werling --, therefor.

In the drawings:
In Fig. 19, Sheet 8 of 10, above Tag "91", delete "6/10".

In Column 6, Line 12, delete "polyetherkeytone;" and insert -- polyetherketone; --, therefor.

In Column 6, Line 54, delete "9 pm/C," and insert -- 9 ppm/C, --, therefor.

In Column 17, Line 16, delete "polyetherkeytone;" and insert -- polyetherketone; --, therefor.

In Column 20, Line 28, in Claim 10, delete "polyetherkeytone." and insert -- polyetherketone. --, therefor.

In Column 20, Line 42, in Claim 15, delete "in claim" and insert -- of claim --, therefor.

Signed and Sealed this
Twenty-eighth Day of June, 2011

David J. Kappos
*Director of the United States Patent and Trademark Office*